United States Patent
Kao et al.

(10) Patent No.: US 8,501,552 B2
(45) Date of Patent: Aug. 6, 2013

(54) PIXEL STRUCTURE AND METHOD OF FABRICATING THE SAME

(75) Inventors: Chin-Tzu Kao, Changhua County (TW); Yu-Tsung Lee, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 0 days.

(21) Appl. No.: 13/369,272

(22) Filed: Feb. 8, 2012

(65) Prior Publication Data

US 2013/0119385 A1  May 16, 2013

(30) Foreign Application Priority Data

Nov. 16, 2011  (TW) .............................. 100141761 A

(51) Int. Cl.
*H01L 21/84* (2006.01)

(52) U.S. Cl.
USPC ............. 438/155; 438/34; 438/151; 438/149; 438/158; 257/59; 257/72; 257/E27.116

(58) Field of Classification Search
USPC .................................... 257/E27.116; 438/34
See application file for complete search history.

(56) References Cited

U.S. PATENT DOCUMENTS

| 5,453,856 | A * | 9/1995 | Kim ............................ 349/140 |
| 6,337,284 | B1 | 1/2002 | Hwang |
| 2010/0187532 | A1 * | 7/2010 | Nagano et al. .................. 257/59 |
| 2012/0080677 | A1 * | 4/2012 | Lee et al. ........................ 257/57 |
| 2012/0280237 | A1 * | 11/2012 | Kwack et al. ................... 257/59 |

FOREIGN PATENT DOCUMENTS

TW     I268620     12/2006

* cited by examiner

*Primary Examiner* — Shouxiang Hu
*Assistant Examiner* — Molly Reida
(74) *Attorney, Agent, or Firm* — Winston Hsu; Scott Margo

(57) ABSTRACT

A pixel structure includes a substrate; a scan line; a gate electrode; an insulating layer disposed on the scan line, the gate electrode and the substrate; a channel and a data line disposed on the insulating layer; a source electrode and a drain electrode disposed on the channel; a passivation layer; a pixel electrode and a connecting electrode. The data line does not overlap the scan line. The passivation layer disposed on the source electrode and the drain electrode includes a first contact hole partially exposing the drain electrode, and a plurality of second contact holes partially exposing the data line or the scan line. The pixel electrode disposed on the passivation layer is electrically connected to the drain electrode through the first contact hole. Furthermore, the connecting electrode disposed on the passivation layer is electrically connected to the data line or the scan line through the second contact holes.

2 Claims, 16 Drawing Sheets

PIXEL STRUCTURE AND METHOD OF FABRICATING THE SAME

BACKGROUND OF THE INVENTION

1. Field of the Invention

The present invention relates to a pixel structure and a method of fabricating the same, and more particularly, to a method of fabricating a pixel structure using a lower amount of masks and the pixel structure.

2. Description of the Prior Art

Thin-film transistors (TFTs) are commonly used as active components in active matrix display panels including active matrix liquid crystal displays and active matrix organic electroluminescent display panels. The conventional TFT including a gate, a source electrode, a drain electrode and a semiconductor layer which includes the channel of the transistor, can be formed through a manufacturing process including at least five lithography processes for defining the patterns of the semiconductor elements. The five lithography processes taken as examples are illustrated below. The first mask is used to define the first metal layer forming the scan line and the gate; the second mask is used to define the semiconductor layer; the third mask is used to define the second metal layer forming the data line, the source electrode and the drain electrode; the fourth mask is used to pattern a passivation layer to form the contact holes; and the fifth mask is used to define a transparent conductive layer forming the pixel electrode.

To reduce the number of masks and simplify the manufacturing process, the half-tone mask is commonly used to serve as the second mask when defining the pattern of the TFT elements. The half-tone mask includes a transparent substrate, a shielding region and a half-tone region disposed thereon. The shielding region is used to define the source electrode and the drain electrode, and the half-tone region is used to define the semiconductor layer underneath the source electrode and the drain electrode. Accordingly, the half-tone mask can substitute for the second mask and the third mask, i.e. only four lithography processes are needed for fabricating the TFT. However, the higher price of the half-tone mask compared to the general mask without the half-tone region disposed thereon is not beneficial, considering the manufacturing cost. Consequently, how to reduce the number of masks and simultaneously reduce the costs in the TFTs manufacturing processes is still an important issue in this field.

SUMMARY OF THE INVENTION

It is one of the objectives of the present invention to provide a pixel structure and a method of fabricating the same in order to reduce the manufacturing costs of the thin-film transistors in the pixel structure by using a general mask to replace the half-tone mask.

According to one exemplary embodiment of the present invention, a method of fabricating a pixel structure includes the following steps. A substrate is provided, and a scan line and a gate electrode are formed on the substrate. Then, an insulating layer and a semiconductor layer are formed sequentially on the substrate, the scan line and the gate electrode. A metal layer is formed on the semiconductor layer and a first patterned photoresist layer having a planar top side is further formed on the metal layer. The metal layer not covered by the first patterned photoresist layer is removed to form an electrode pattern and a data line, and the semiconductor layer not covered by the first patterned photoresist layer is removed to form a channel, and the data line does not overlap the scan line. Subsequently, an ashing process is performed upon the first patterned photoresist layer to decrease the thickness of the first patterned photoresist layer to form a second patterned photoresist layer. The second patterned photoresist layer partially exposes the electrode pattern, and a top side of the second patterned photoresist layer and a top side of the electrode pattern are coplanar. Furthermore, the electrode pattern not covered by the second patterned photoresist layer is removed to form a source electrode and a drain electrode, and then the second patterned photoresist layer is removed. Moreover, a passivation layer is formed on the source electrode, the drain electrode and the data line, and the passivation layer includes a first contact hole partially exposing the drain electrode and a plurality of second contact holes partially exposing the data line or the scan line. Additionally, a patterned transparent conductive layer is formed on the passivation layer, the patterned transparent conductive layer includes a pixel electrode and a connecting electrode. The pixel electrode is electrically connected to the drain electrode through the first contact hole, and the connecting electrode is electrically connected to the data line or the scan line through the second contact holes.

According to another exemplary embodiment of the present invention, a pixel structure is provided. The pixel structure includes a substrate, a scan line, a gate electrode, an insulating layer, a channel, a data line, a source electrode, a drain electrode, a passivation layer, a pixel electrode and a connecting electrode. The scan line and the gate electrode are disposed on the substrate, and the insulating layer is disposed on the scan line, the gate electrode and the substrate. The channel disposed on the insulating layer corresponds to the gate electrode. The data line is disposed on the insulating layer, and the data line does not overlap the scan line. The source electrode and the drain electrode are disposed on the channel, and the passivation layer is disposed on the source electrode, the drain electrode and the data line. The passivation layer includes a first contact hole partially exposing the drain electrode, and a plurality of second contact holes partially exposing the data line or the scan line. The pixel electrode disposed on the passivation layer is electrically connected to the drain electrode through the first contact hole. Furthermore, the connecting electrode disposed on the passivation layer is electrically connected to the data line or the scan line through the second contact holes.

The present invention replaces the half-tone mask by a general mask to complete the formation of the thin-film transistor (TFT) in a pixel structure only through four lithography processes to reduce the manufacturing costs. Additionally, in the pixel structure, the data line and the scan line do not overlap each other. The data line may include data line segments separated from each other, respectively disposed at two sides of the scan line and electrically connected to each other by the connecting electrode; or analogically, the scan line may include scan line segments separated from each other, respectively disposed at two sides of the data line and electrically connected to each other by the connecting electrode. The pixel structure deposition can avoid the damage of the upper data line due to the overlap of the scan line and the data line, which is beneficial for the data line to maintain the normal function, for example, to normally deliver the signals to the corresponding pixel structure.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail herein. The preferred exemplary embodiments of the present invention are illustrated in the accompanying drawings with numbered elements.

Please refer to FIG. 1 through FIG. 14. FIG. 1 through FIG. 14 are schematic diagrams illustrating a method of fabricating a pixel structure according to the first exemplary embodiment of the present invention. FIG. 1, FIG. 5, FIG. 9, FIG. 11, FIG. 13 are top view illustrating the method of fabricating the pixel structure, and FIG. 2, FIG. 3, FIG. 4, FIG. 6, FIG. 7, FIG. 8, FIG. 10, FIG. 12, FIG. 14 are cross-sectional view illustrating the method of fabricating the pixel structure.

Figure 1:
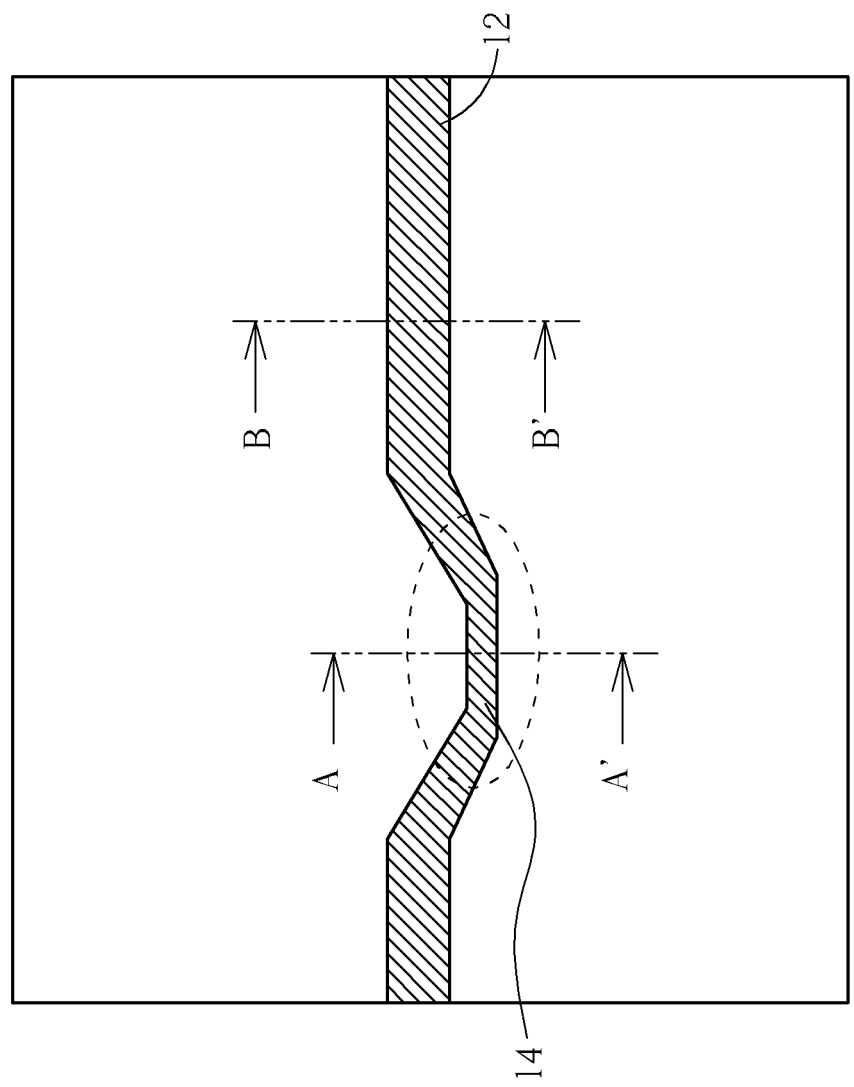
FIG. 1 through FIG. 14 are schematic diagrams illustrating a method of fabricating a pixel structure according to the first exemplary embodiment of the present invention.
Figure 2:
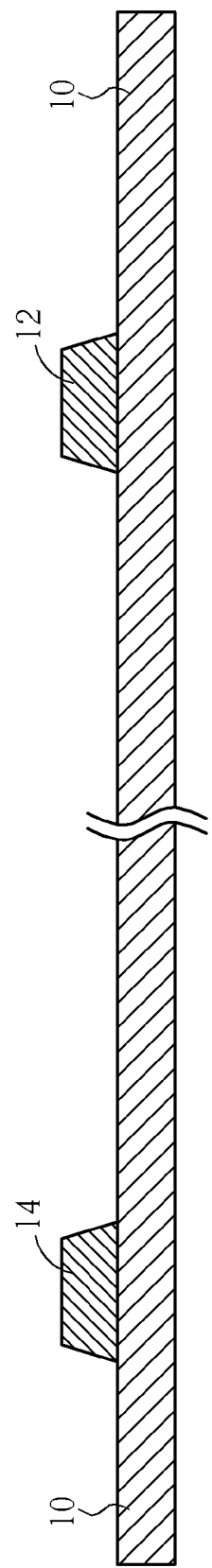

FIG. 2 is a cross-sectional view illustrating the pixel structure taken along the line AA' and the line BB' of FIG. 1 according to the first exemplary embodiment of the present invention. As shown in FIG. 1 and FIG. 2. A substrate 10 is provided, and the substrate 10 may include a hard substrate made of glass, quartz or plastic, or a flexible substrate. A scan line 12 and a gate electrode 14 are formed on the substrate 10, the method of fabricating the scan line 12 and the gate electrode 14 may include the following steps. First, a conductive layer (not shown) is formed overall the substrate 10 through a physical vapor deposition (PVD) process such as sputtering process and evaporation process, chemical vapor deposition (CVD) process, or other thin-film deposition process. Then, a patterning process such as a lithography process is performed to form the scan line 12 and the gate electrode 14. The scan line 12 and the gate electrode 14 are electrically connected to each other and form a continuous line segment.

Figure 3:
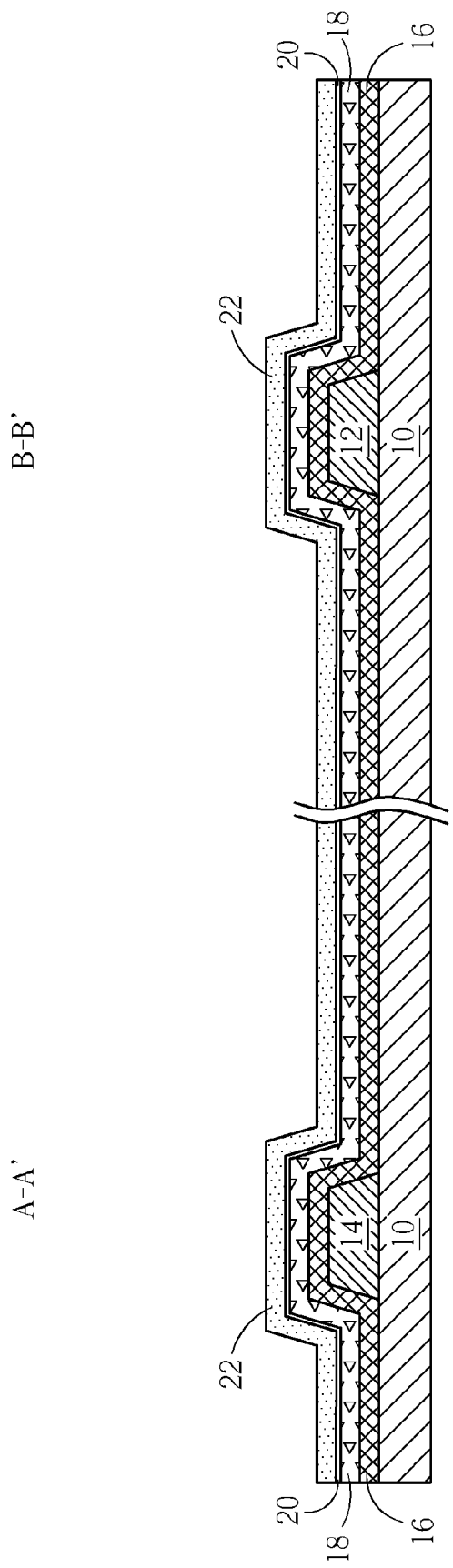

As shown in FIG. 3, an insulating layer 16 and a semiconductor layer 18 are formed sequentially on the substrate 10, the scan line 12 and the gate electrode 14, and a metal layer 22 is formed on the semiconductor layer 18. The material of the insulating layer 16 may include silicon oxide, silicon nitride, silicon oxynitride or other dielectric materials, the semiconductor layer 18 could be made of amorphous silicon or other semiconductor material, and the metal layer 22 could be made of aluminum (Al), molybdenum (Mo), chromium (Cr), tungsten (W), copper (Cu) or any combination thereof, but not limited thereto. Furthermore, for reducing the resistance between the metal layer 22 and the semiconductor layer 18, an ohmic contact layer 20 is selectively formed on the semiconductor layer 18 before the formation of the metal layer 22.

Figure 4:
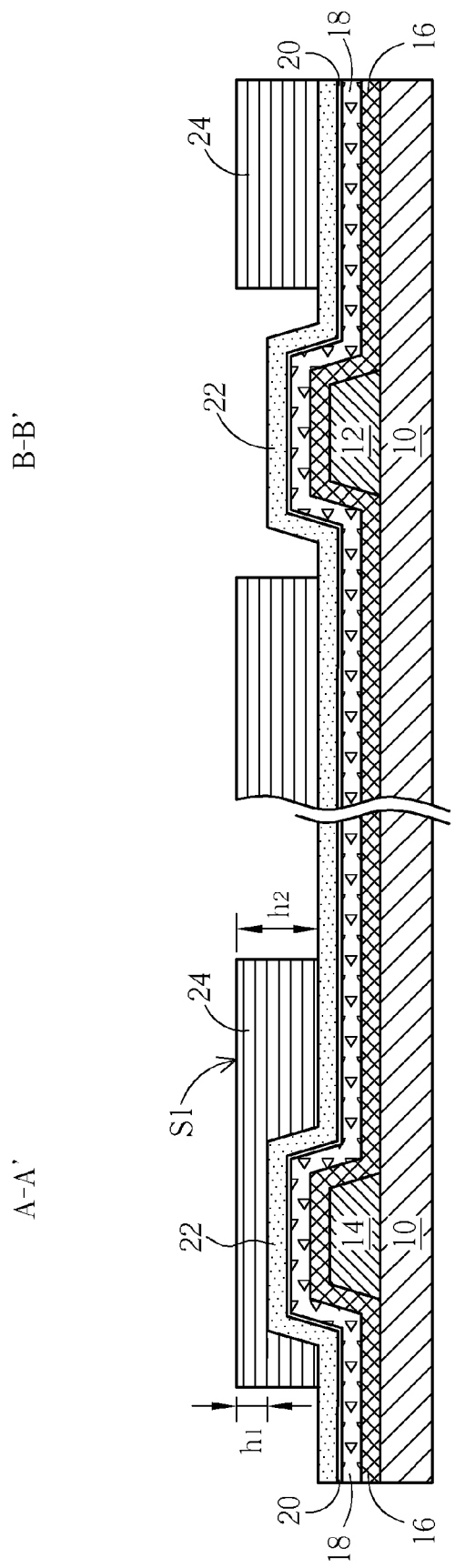

As shown in FIG. 4, a first patterned photoresist layer 24 is formed on the metal layer 22. The first patterned photoresist layer 24 has a planar top side S1 and totally overlaps the gate electrode 14. Additionally, it is preferable that the first patterned photoresist layer 24 does not overlap the scan line 12, but not limited thereto; the first patterned photoresist layer 24 could partially overlap the scan line 12. The method of forming the first patterned photoresist layer 24 includes the following steps. First, a photoresist layer (not shown) is formed on the metal layer 22, and the photoresist layer may have a planar top side due to its characteristic of self-planarization. Then, a general mask without the half-tone region disposed thereon is used in the lithography process instead of the half-tone mask to form the first patterned photoresist layer 24. In other words, the first patterned photoresist layer 24 is not fabricated by a half-tone mask. The general mask allows the same amount of light passing through any part of the general mask. Accordingly, the formed first patterned photoresist layer 24 may still have a planar top side after the lithography process. A thickness of the first patterned photoresist layer 24 varies depending on the surface configuration of the metal layer 22. More specifically, the thickness of the first patterned photoresist layer 24 is inversely proportional to the thickness of the formed structures on the substrate 10. For example, a thickness h1 of the first patterned photoresist layer 24 above the gate electrode 14 is substantially smaller than a thickness h2 of the first patterned photoresist layer 24 above the area at the two sides of the gate electrode 14. Please refer to the cross-sectional view taken along the line BB' in FIG. 4: the first patterned photoresist layer 24 is disposed at the two sides of the metal layer 22 above the data line 12, and the top side of the first patterned photoresist layer 24 is preferably higher than the top side of the metal layer 22. In this exemplary embodiment, it is preferable to use the same mask to define the first patterned photoresist layer 24 above the gate electrode 14 and above the data line 12, but not limited thereto.

Figure 5:
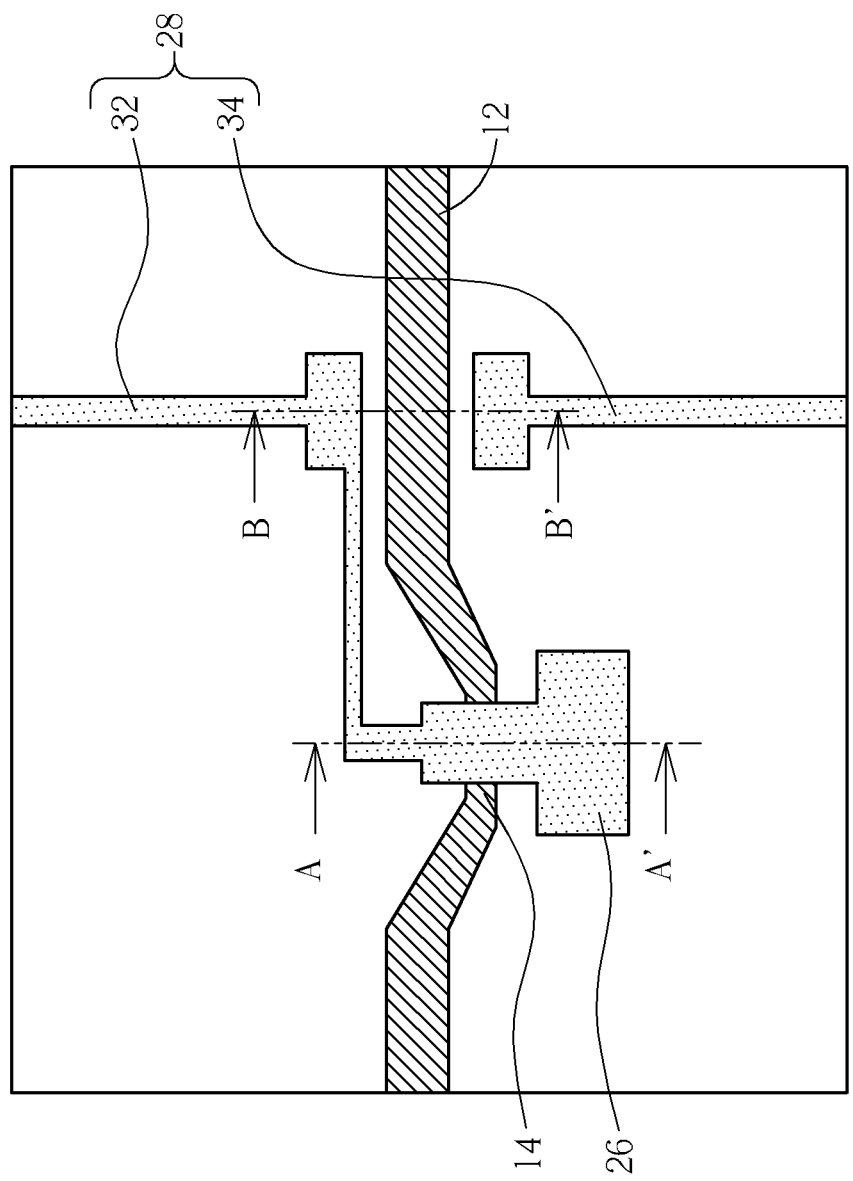
Figure 6:
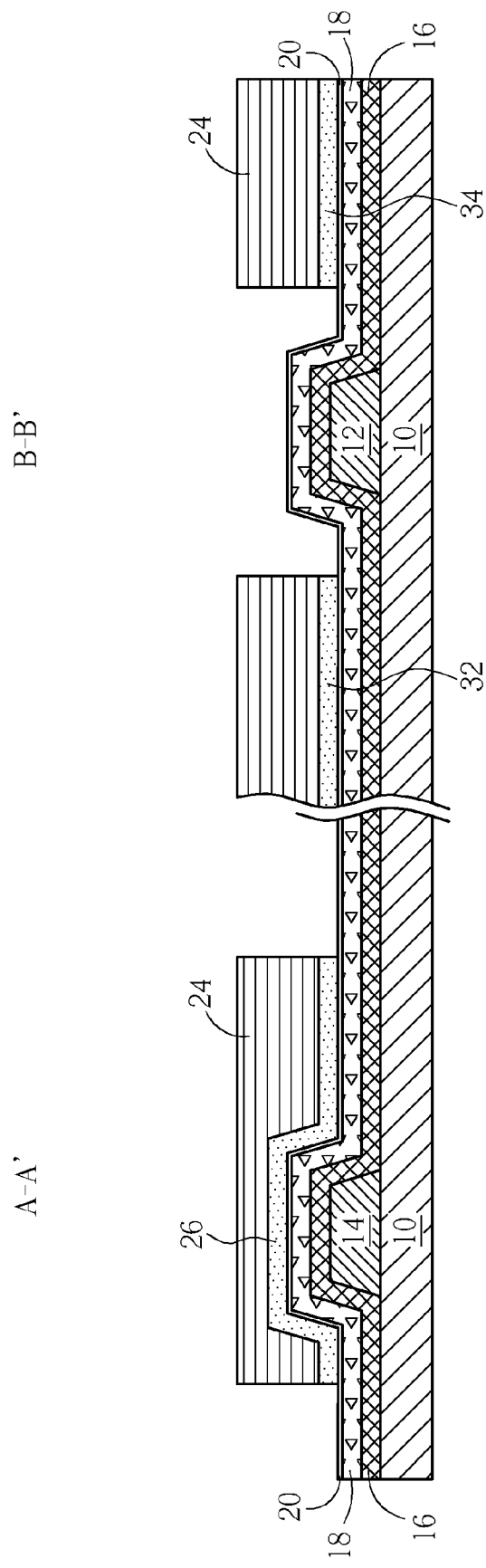
Figure 7:
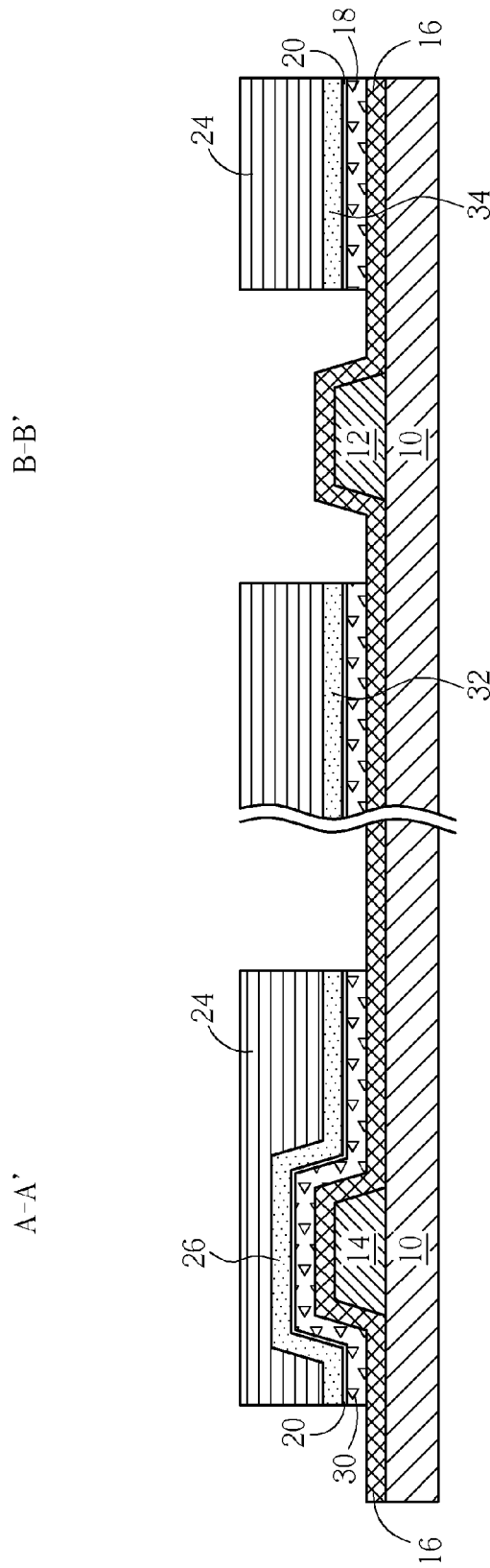

FIG. 6 is a cross-sectional view illustrating the pixel structure taken along the line AA' and the line BB' of FIG. 5 according to the first exemplary embodiment of the present invention. As shown in FIG. 5 and FIG. 6, the metal layer 22 not covered by the first patterned photoresist layer 24 is removed to form an electrode pattern 26 and a data line 28, and a part of the ohmic contact layer 20 could be exposed. The method of removing a part of the metal layer 22 may include performing a wet etching process. The electrode pattern 26 corresponds to the gate electrode 14, i.e. the electrode pattern 26 overlaps the gate electrode 14. The data line 28 includes a first data line segment 32 and a second data line segment 34 separated from each other and respectively disposed at two sides of the scan line 12. Afterwards, as shown in FIG. 7, the ohmic contact layer 20 not covered by the first patterned photoresist layer 24 is removed, and the semiconductor layer 18 not covered by the first patterned photoresist layer 24 is removed to form a channel 30. Moreover, a part of the insulating layer 16 could be exposed. The method of removing a part of the ohmic contact layer 20 and a part of the semiconductor layer 18 may include performing a dry etching process. It is appreciated that the data line 28 does not overlap the scan line 12.

Figure 8:
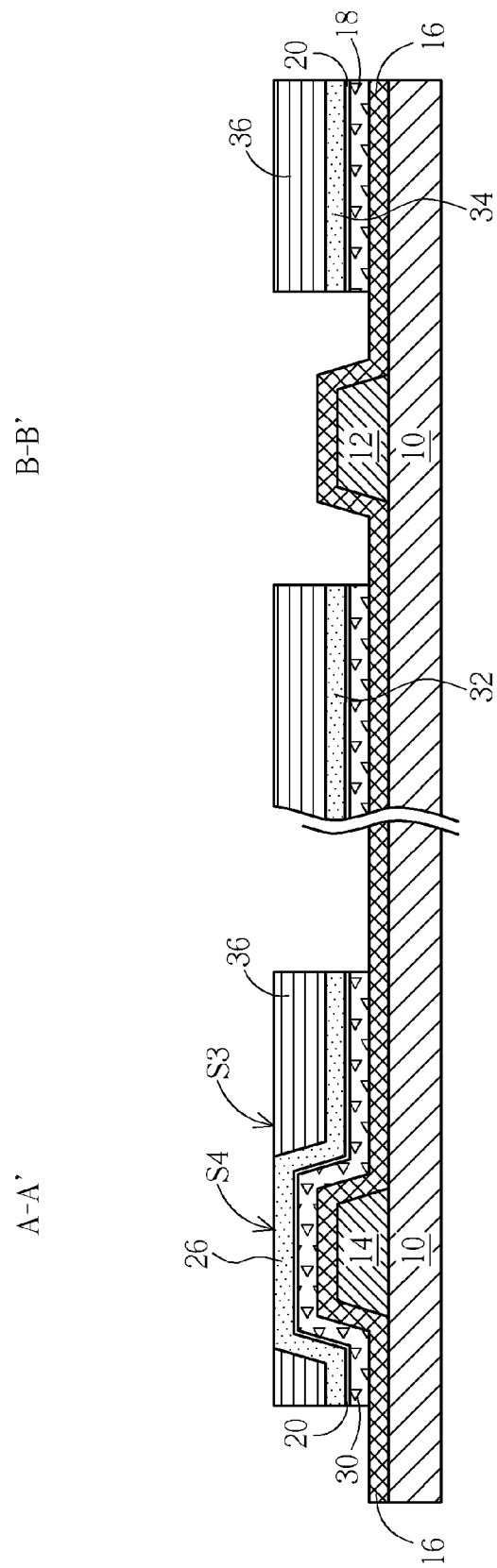

As shown in FIG. 8, after removing a part of the metal layer 22, a part of the ohmic contact layer 20 and a part of the semiconductor layer 18, an ashing process is preformed upon the first patterned photoresist layer 24 for reducing a thickness of the first patterned photoresist layer 24 to form a second patterned photoresist layer 36. More specifically, please refer to FIG. 4 again, wherein a thickness h1 of the first patterned photoresist layer 24 above the gate electrode 14 is substantially smaller than a thickness h2 of the first patterned photoresist layer 24 above the area at the two sides of the gate electrode 14, after the execution of the ashing process, the first patterned photoresist layer 24 above the gate electrode 14 may be totally removed, and the first patterned photoresist layer 24 above the area at the two sides of the gate electrode 14 would remain; accordingly, the second patterned photoresist layer 36 is formed. Furthermore, the first patterned photoresist layer 24 above the scan line 12 is also partially removed through the ashing process to form the second patterned photoresist layer 36 having a smaller thickness than the first patterned photoresist layer 24. It is preferable that the second patterned photoresist layer 36 does not expose the nonconsecutive data line 28 underneath, i.e. the first data line segment 32 and the second data line segment 34. Additionally, the second patterned photoresist layer 36 above the gate electrode 14 may partially expose the electrode pattern 26, and a top side S3 of the second patterned photoresist layer 36 above the gate electrode 14 and a top side S4 of the electrode pattern 26 are coplanar, that is, the top side S3 of the second patterned photoresist layer 36 preferably neighbors and contacts the top side S4 of the electrode pattern 26.

Figure 9:
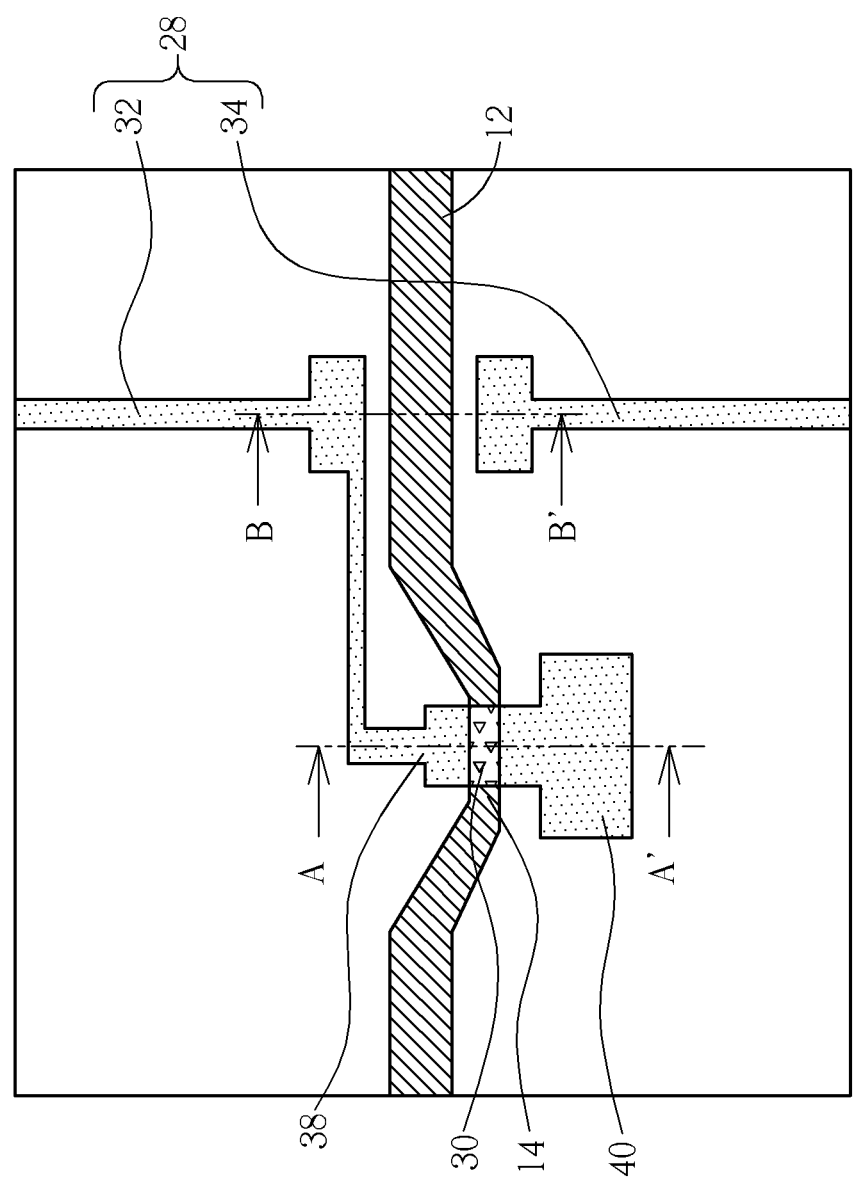
Figure 10:
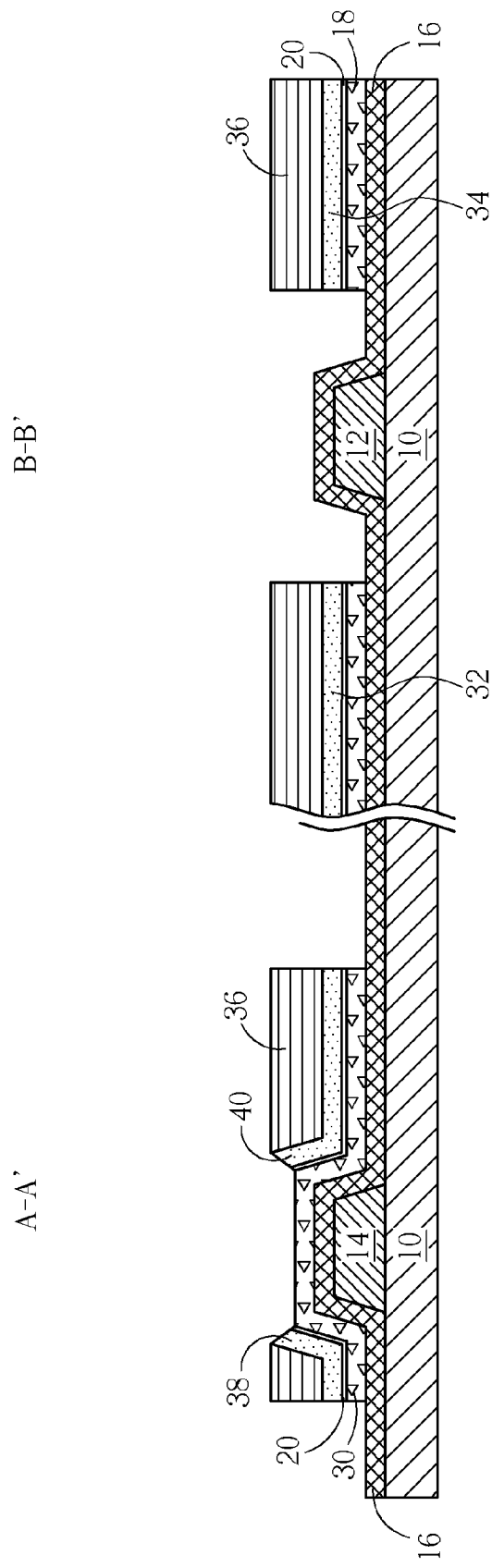

FIG. 10 is a cross-sectional view illustrating the pixel structure taken along the line AA' and the line BB' of FIG. 9 according to the first exemplary embodiment of the present invention. As shown in FIG. 9 and FIG. 10, the electrode pattern 26 not covered by the second patterned photoresist layer 36 is removed to form a source electrode 38 and a drain electrode 40, and the ohmic contact layer 20 that is not covered by the second patterned photoresist layer 36 and between the source electrode 38 and the drain electrode 40 is removed as well. The method may include the following steps. A wet etching process is performed to remove a part of the electrode pattern 26 to expose the ohmic contact layer 20, and a dry etching process is further performed to remove a part of the ohmic contact layer 20 to expose the channel 30, in which the exposed channel 30 may be the electron channel of the later formed thin-film transistor (TFT), and the length to width ratio of the channel 30 could be adjusted by modifying the width of the gate electrode 14. In another aspect, the second patterned photoresist layer 36 above the scan line 12 in the cross-sectional view taken along the line BB' may totally cover the first data line segment 32 and the second data line segment 34 to avoid damaging the formed first data line segment 32 and the formed second data line segment 34 during the process of removing a part of the electrode pattern 26 and the ohmic contact layer 20 between the source electrode 38 and the drain electrode 40.

Figure 11:
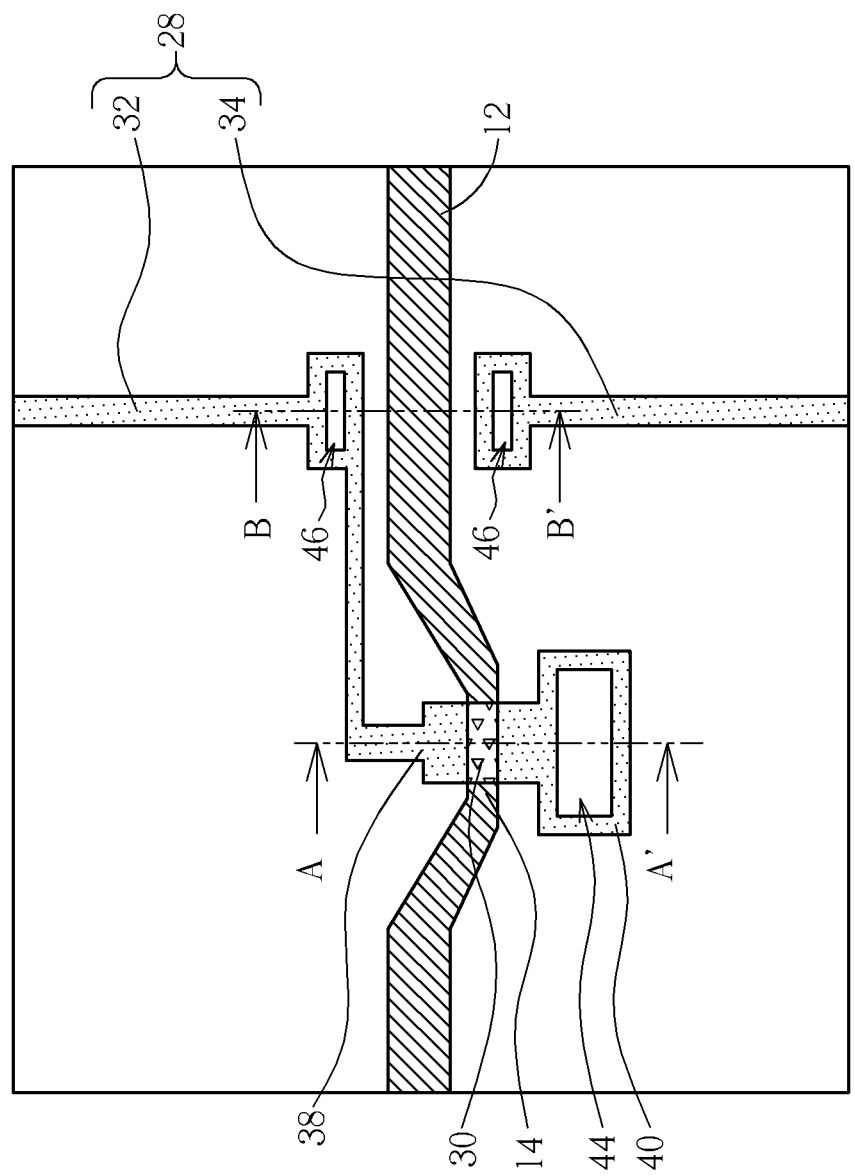
Figure 12:
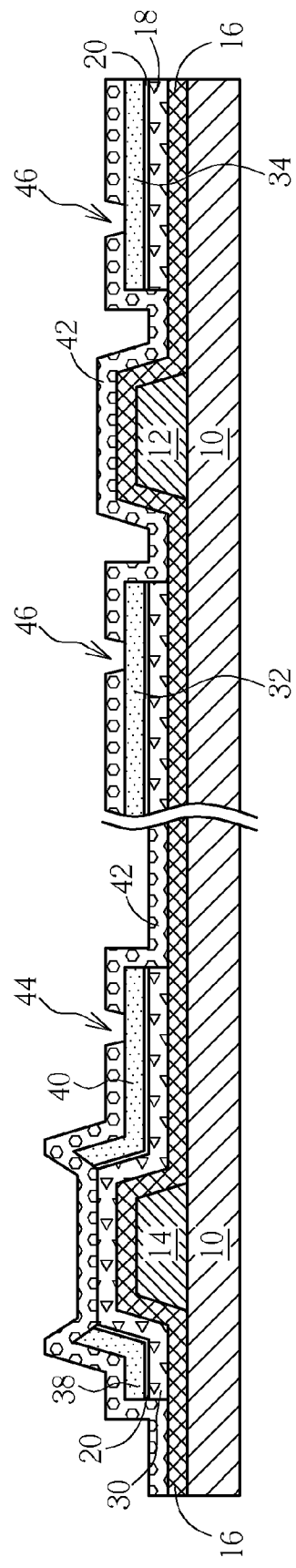
Figure 13:
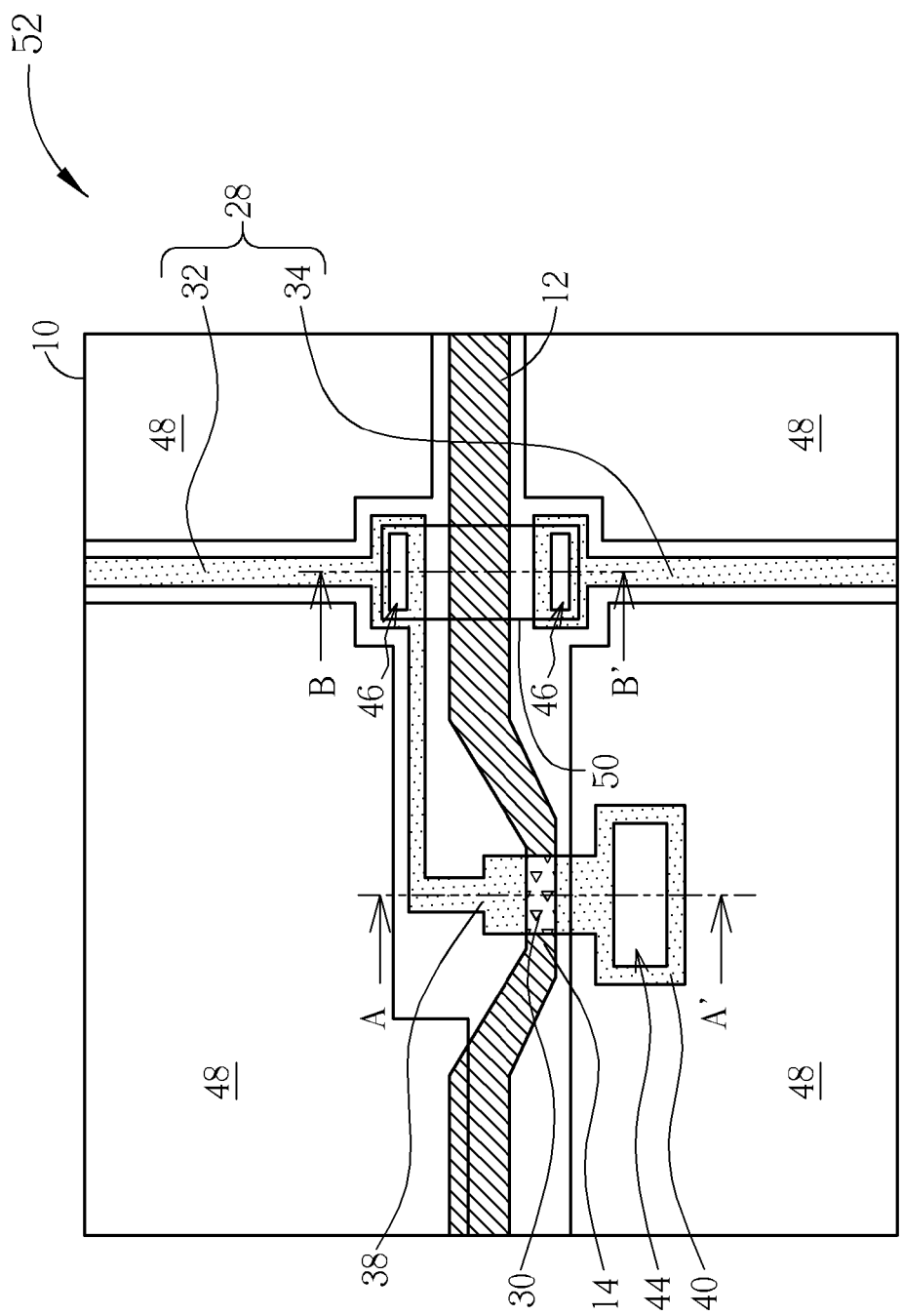
Figure 14:
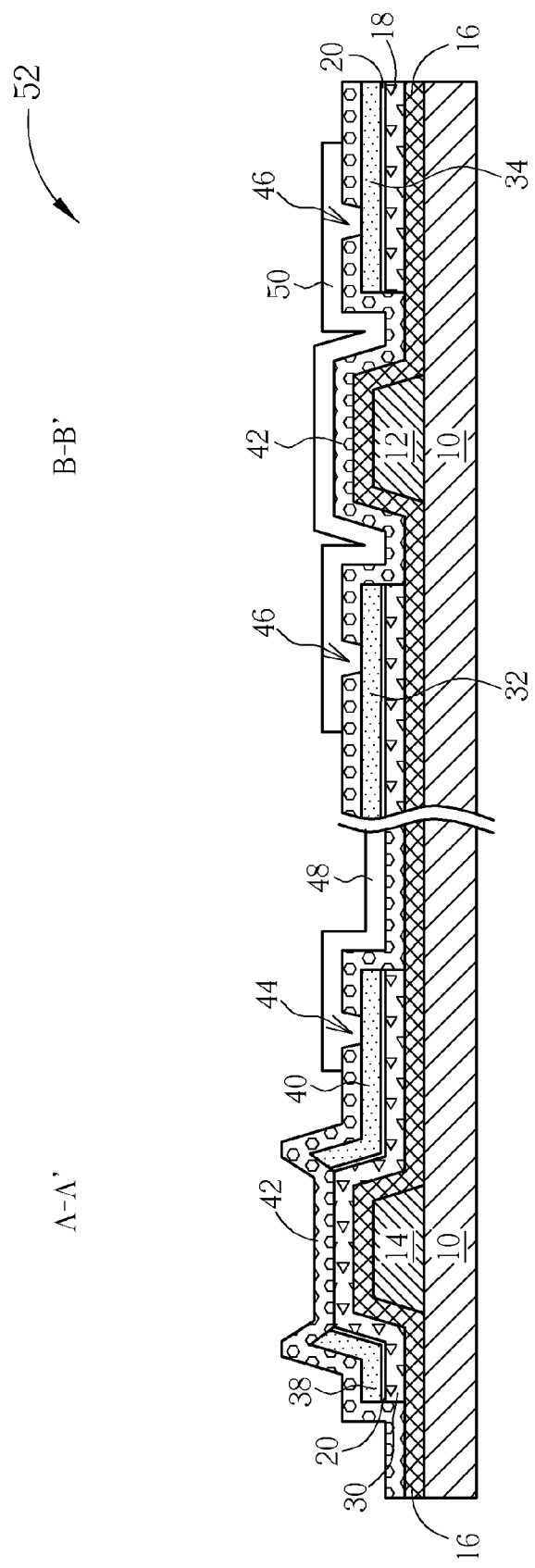

FIG. 12 is a cross-sectional view illustrating the pixel structure taken along the line AA' and the line BB' of FIG. 11 according to the first exemplary embodiment of the present invention. As shown in FIG. 11 and FIG. 12, the second patterned photoresist layer 36 is removed, and at least one passivation layer 42 is formed on the source electrode 38, the drain electrode 40 and the data line 28. The passivation layer 42 includes a first contact hole 44 partially exposing the drain electrode 40, and a plurality of second contact holes 46 partially exposing the data line 28, in which the second contact holes 46 of the passivation layer 42 respectively and partially exposes the first data line segment 32 and the second data line segment 34. FIG. 14 is a cross-sectional view illustrating the pixel structure taken along the line AA' and the line BB' of FIG. 13 according to the first exemplary embodiment of the present invention. As shown in FIG. 13 and FIG. 14, a patterned transparent conductive layer is formed on the passivation layer 42, and the patterned transparent conductive layer includes a pixel electrode 48 and a connecting electrode 50. The pixel electrode 48 is electrically connected to the drain electrode 40 through the first contact hole 44, and the connecting electrode 50 is electrically connected to the data line 28 through the second contact holes 46, more specifically, the connecting electrode 50 is electrically connected to the first data line segment 32 and the second data line segment 34 through the second contact holes 46. Accordingly, the four lithography processes for forming the TFT in a pixel structure 52 are completed.

Please refer to FIG. 13 and FIG. 14 again. As shown in FIG. 13 and FIG. 14, in the present invention, a pixel structure 52 includes a substrate 10, a scan line 12, a gate electrode 14, an insulating layer 16, a channel 30, a data line 28, a source electrode 38, a drain electrode 40, a passivation layer 42, a pixel electrode 48 and a connecting electrode 50. The scan line 12 and the gate electrode 14 are disposed on the substrate 10, and the insulating layer 16 is disposed on the scan line 12, the gate electrode 14 and the substrate 10. The channel 30 disposed on the insulating layer 16 corresponds to the gate electrode 14, and the data line 28 disposed on the insulating layer 16 does not overlap the scan line 12. In the first exemplary embodiment, the data line 28 includes a first data line segment 32 and a second data line segment 34 separated from each other and respectively disposed at two sides of the scan line 12. The source electrode 38 and the drain electrode 40 are disposed on the channel 30. To reduce the resistance between the source electrode 38, the drain electrode 40 and the channel 30, the pixel structure 52 may further include an ohmic contact layer 20 disposed between the source electrode 38 and the channel 30, and between the drain electrode 40 and the channel 30. The passivation layer 42 is disposed on the source electrode 38, the drain electrode 40 and the data line 28. The passivation layer 42 includes a first contact hole 44 partially exposing the drain electrode 40 and a plurality of second contact holes 46 partially exposing the data line 28. Furthermore, the second contact holes 46 of the passivation layer 42 respectively partially expose the first data line segment 32 and the second data line segment 34. The pixel electrode 48 is disposed on the passivation layer 42, is electrically connected to the drain electrode 40 through the first contact hole 44, and the connecting electrode 50 is disposed on the passivation layer 42 and is electrically connected to the data line 28 through the second contact holes 46, more specifically, the connecting electrode 50 is respectively electrically connected to the first data line segment 32 and to the second data line segment 34 through the second contact holes 46. Accordingly, the first data line segment 32 may be electrically connected to the second data line segment 34 through the connecting electrode 50. It is appreciated that, in the pixel structure 52 of the present invention, the data line 28 does not overlap the scan line 12, and the data line segments respectively disposed at two sides of the scan line 12 could be electrically connected to each other through the connecting electrode 50. Accordingly, the damage of the data line occurred at the intersection of the data line and the scan line due to the thick thickness of the formed structures underneath the data line can be avoided, which is done to maintain the normal function of the data line.

The pixel structure of the present invention is not limited to the first exemplary embodiment. To simplify the explanation and to clarify the comparison, the same components are referred to with the same numerals in the following exemplary embodiments, and only the differences are discussed while the similarities are not mentioned again.

Figure 15:
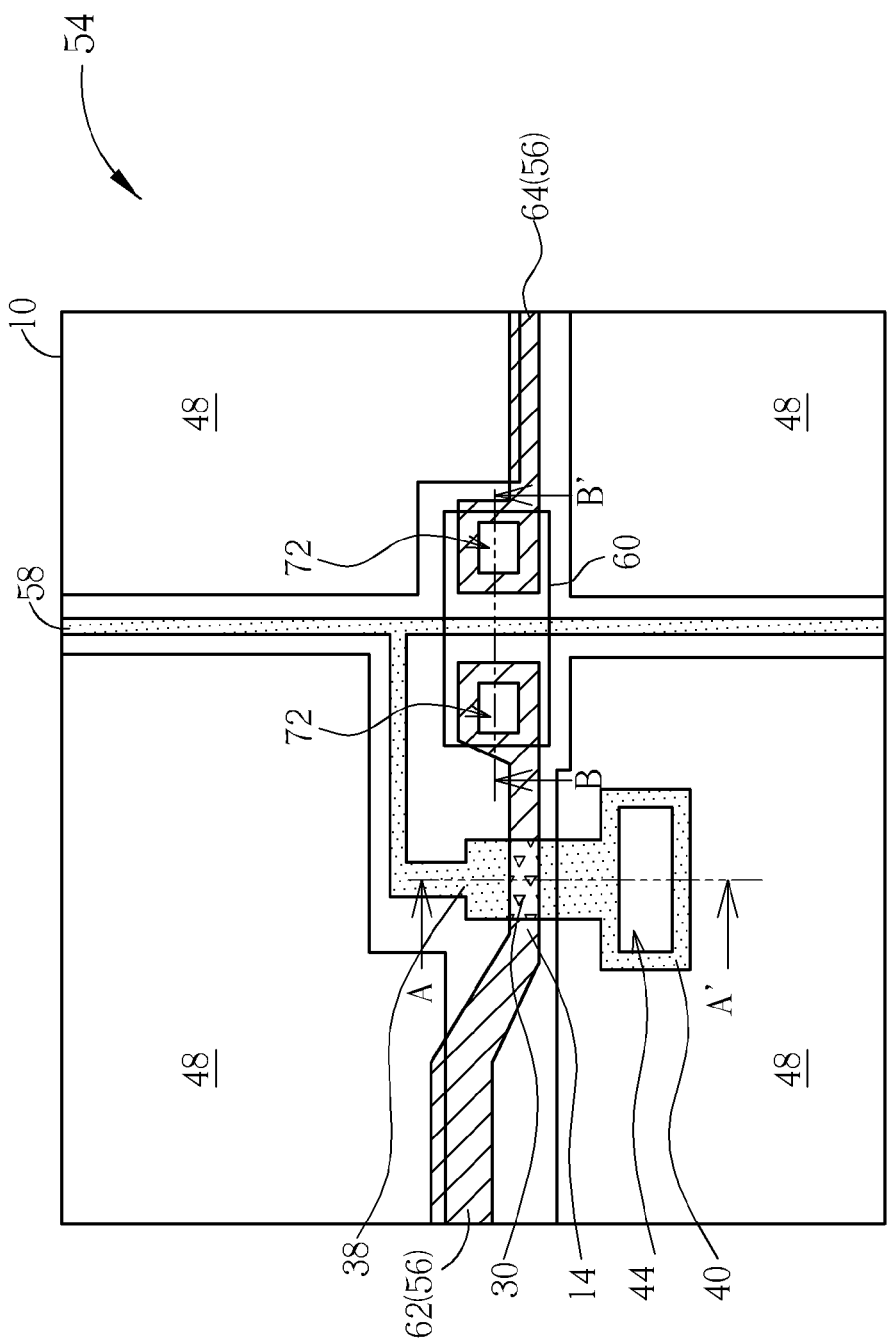
FIG. 15 and FIG. 16 are schematic diagrams illustrating a method of fabricating a pixel structure according to the second exemplary embodiment of the present invention.
Figure 16:
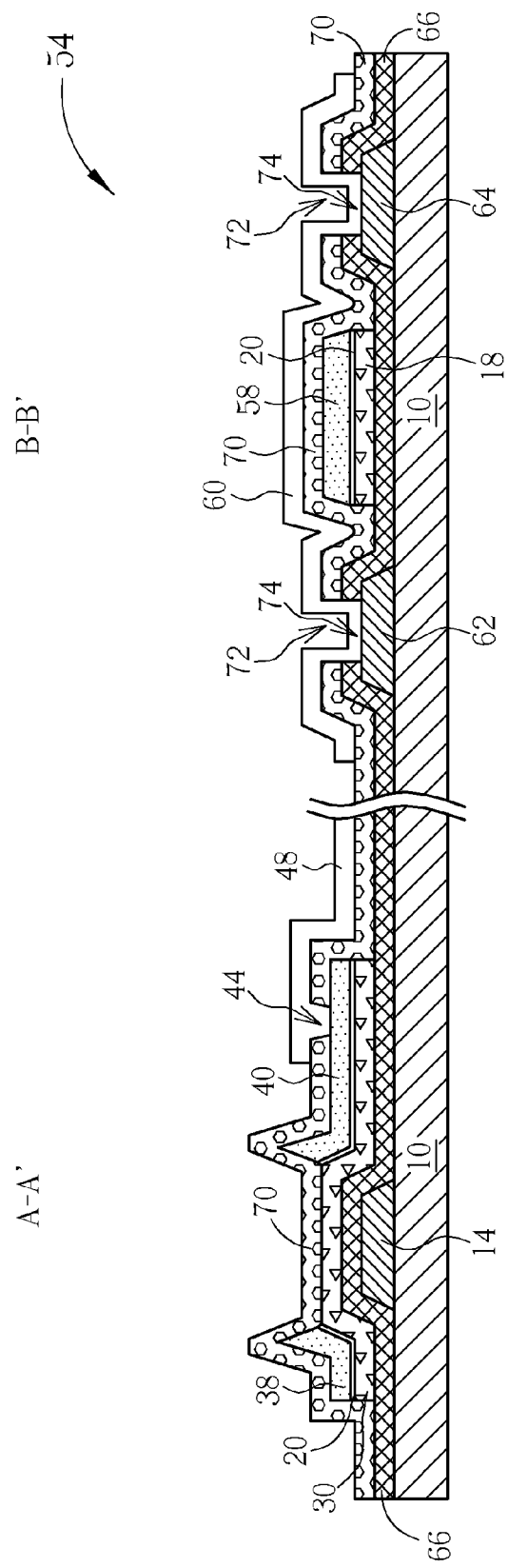

Please refer to FIG. 15 and FIG. 16. FIG. 15 and FIG. 16 are schematic diagrams illustrating a method of fabricating a pixel structure according to the second exemplary embodiment of the present invention. FIG. 15 is top view illustrating the pixel structure according to the second exemplary embodiment, and FIG. 16 is a cross-sectional view illustrating the pixel structure taken along the line AA' and the line BB' of FIG. 15. As shown in FIG. 15 and FIG. 16, the method of fabricating the pixel structure 54 in the second exemplary embodiment includes the following steps. A substrate 10 is provided; the scan line 56 and the gate electrode 14 are formed on the substrate 10. Unlike in the first exemplary embodiment, the scan line 56 is nonconsecutive, i.e. the scan line 56 includes a first scan line segment 62 and a second scan line segment 64 separated from each other. The gate electrode 14 and the first scan line segment 62 electrically connected to each other constitute a consecutive line segment. An insulating layer 66 and a semiconductor layer 18 are formed sequentially on the substrate 10, the scan line 56 and the gate electrode 14. Furthermore, a metal layer (not shown) is formed on the semiconductor layer 18. Before forming the metal layer, an ohmic contact layer 20 could be selectively formed on the semiconductor layer 18. Then, a first patterned photoresist layer (not shown) is formed on the metal layer. The first patterned photoresist layer is not fabricated by a half-tone mask; accordingly, the first patterned photoresist layer has a planar top side. The first patterned photoresist layer totally overlaps the gate electrode 14, and preferably does not overlap the scan line 56, but not limited thereto, the first patterned photoresist layer could partially overlap the scan line 56. Subsequently, the metal layer not covered by the first patterned photoresist layer is removed to form an electrode pattern (not shown) and a data line 58, and the data line 58 does not overlap the scan line 56. The scan line 56 includes the first scan line segment 62 and the second scan line segment 64 separated from each other and respectively disposed at two sides of the data line 58.

The steps of forming the channel 30, the source electrode 38 and the drain electrode 40 are similar to those of the first exemplary embodiment, please refer to the illustrated explanation, and refer to FIG. 7, FIG. 8 and FIG. 10 together. The semiconductor layer 18 and the ohmic contact layer 20 not covered by the first patterned photoresist layer are removed to form the channel 30 above the gate electrode 14, and a part of the insulating layer 66 may be exposed. Then, an ashing process is performed upon the first patterned photoresist layer for reducing a thickness of the first patterned photoresist layer to form the second patterned photoresist layer (not shown). The second patterned photoresist layer may partially expose the electrode pattern, and a top side of the second patterned photoresist layer and a top side of the electrode pattern are coplanar. The electrode pattern not covered by the second patterned photoresist layer may be further removed to form the source electrode 38 and the drain electrode 40. Subsequently, the second patterned photoresist layer is removed.

At least a passivation layer 70 is formed on the source electrode 38, the drain electrode 40 and the data line 58. The passivation layer 70 includes a first contact hole 44 partially exposing the drain electrode 40, and a plurality of second contact holes 72 partially exposing the scan line 56. A patterned transparent conductive layer is formed on the passivation layer 70, and the patterned transparent conductive layer includes the pixel electrode 48 and a connecting electrode 60. The pixel electrode 48 is electrically connected to the drain electrode 40 through the first contact hole 44, and the connecting electrode 60 is electrically connected to the scan line 56 through the second contact holes 72. Unlike in the first exemplary embodiment, the insulating layer 66 may further include a plurality of third contact holes 74. The third contact holes 74 corresponding to the second contact holes 72 respectively expose the first scan line segment 62 and the second scan line segment 64. In this exemplary embodiment, the connecting electrode 60 may be respectively electrically connected to the first scan line segment 62 and the second scan line segment 64 through the second contact holes 72 and the third contact holes 74. Accordingly, the four lithography processes for forming the TFT in the pixel structure 54 are completed. The present invention uses a general mask to complete the TFT process of the pixel structure 54 instead of a half-tone mask for saving the mask cost.

As shown in FIG. 15 and FIG. 16, in the second exemplary embodiment, the pixel structure 54 includes a substrate 10, a scan line 56, a gate electrode 14, an insulating layer 66, a channel 30, a data line 58, a source electrode 38, a drain electrode 40, a passivation layer 70, a pixel electrode 48 and a connecting electrode 60. Compared to the pixel structure 52 of the first exemplary embodiment, the scan line 56 includes the first scan line segment 62 and the second scan line segment 64 separated from each other and respectively disposed at two sides of the data line 58. Furthermore, the passivation layer 70 disposed on the source electrode 38, the drain electrode 40 and the data line 58 includes a first contact hole 44 partially exposing the drain electrode 40 and the second contact holes 72 partially exposing the scan line 56. It is appreciated that, the insulating layer 66 is disposed between the scan line 56 and the passivation layer 70, therefore, to expose the scan line 56 through the second contact holes 72, the insulating layer 66 may further include the third contact holes 74 connected to the corresponding second contact holes 72 for respectively partially exposing the first scan line segment 62 and to the second scan line segment 64. The pixel electrode 48 disposed on the passivation layer 70 is electrically connected to the drain electrode 40 through the first contact hole 44, and the connecting electrode 60 disposed on the passivation layer 70 is electrically connected to the scan line 56 through the second contact holes 72 and the third contact holes 74. More specifically, the connecting electrode 60 is respectively electrically connected to the first scan line segment 62 and to the second scan line segment 64 through the second contact holes 72 and the third contact holes 74, accordingly, the first scan line segment 62 and the second scan line segment 64 are electrically connected to each other through the connecting electrode 60. Analogically, the data line 58 does not overlap the scan line 56, and the scan line segments respectively disposed at two sides of the data line 58 could be electrically connected to each other through the connecting electrode 60. Accordingly, the damage of the data line occurring at the intersection of the data line and the scan line due to the thick thickness of the formed structures underneath the data line can be avoided, which is done to maintain the normal function of the data line.

In conclusion, the present invention uses a general mask instead of the half-tone mask to complete the formation of the thin-film transistor (TFT) in a pixel structure through only four lithography processes to reduce the manufacturing costs. Additionally, in the pixel structure, the data line and the scan line do not overlap each other, and the connecting electrode is used to electrically connect the data line segments to the scan line segments separated from each other and respectively disposed at two sides of the scan line to the data line. The pixel structure deposition can avoid the damage of the upper data line due to the overlap of the scan line and the data line, which is beneficial for the data line to maintain the normal function, for example, to normally deliver signals to the corresponding pixel structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method of fabricating a pixel structure, comprising:
providing a substrate;
forming a scan line and a gate electrode on the substrate;
forming an insulating layer and a semiconductor layer sequentially on the substrate, the scan line and the gate electrode;
forming a metal layer on the semiconductor layer;

forming a first patterned photoresist layer on the metal layer, wherein the first patterned photoresist layer has a planar top side;

removing the metal layer not covered by the first patterned photoresist layer to form an electrode pattern and a data line, and removing the semiconductor layer not covered by the first patterned photoresist layer to form a channel, wherein the data line does not overlap the scan line;

performing an ashing process upon the first patterned photoresist layer for reducing a thickness of the first patterned photoresist layer to form a second patterned photoresist layer, wherein the second patterned photoresist layer partially exposes the electrode pattern, and a top side of the second patterned photoresist layer and a top side of the electrode pattern are coplanar;

removing the electrode pattern not covered by the second patterned photoresist layer to form a source electrode and a drain electrode;

removing the second patterned photoresist layer;

forming at least one passivation layer on the source electrode, the drain electrode and the data line, wherein the passivation layer has a first contact hole partially exposing the drain electrode, and a plurality of second contact holes partially exposing the data line or the scan line; and forming a patterned transparent conductive layer on the passivation layer, wherein the patterned transparent conductive layer comprises a pixel electrode electrically connected to the drain electrode through the first contact hole and a connecting electrode electrically connected to the data line or the scan line through the second contact holes, wherein the data line comprises a first data line segment and a second data line segment separated from each other and respectively disposed at two sides of the scan line, the second contact holes of the passivation layer respectively partially expose the first data line segment and the second data line segment, and the connecting electrode is electrically connected to the first data line segment and the second data line segment through the second contact holes.

2. The method of fabricating the pixel structure according to claim 1, further comprising:

forming an ohmic contact layer on the semiconductor layer before the step of forming the metal layer;

removing the ohmic contact layer not covered by the first patterned photoresist layer; and removing the ohmic contact layer not covered by the second patterned photoresist layer.

* * * * *